United States Patent [19]

Morimoto

[11] Patent Number: 5,604,667

[45] Date of Patent: * Feb. 18, 1997

[54] MOUNTING STRUCTURE FOR MOUNTING A PIEZOELECTRIC ELEMENT

[75] Inventor: Ryoichi Morimoto, Kyoto, Japan

[73] Assignee: Murata Mfg. Co., Ltd., Nagaokakyo, Japan

[ * ] Notice: The term of this patent shall not extend beyond the expiration date of Pat. No. 5,359,494.

[21] Appl. No.: 496,918

[22] Filed: Jun. 30, 1995

Related U.S. Application Data

[63] Continuation of Ser. No. 255,362, Jun. 8, 1994, abandoned, which is a continuation of Ser. No. 134,415, Oct. 8, 1993, Pat. No. 5,359,494.

[30] Foreign Application Priority Data

Oct. 13, 1992 [JP] Japan .................................. 4-77526 U
Jan. 8, 1993 [JP] Japan .................................. 5-2825 U

[51] Int. Cl.⁶ .............................. H05K 7/02; H01L 41/04
[52] U.S. Cl. .......................... 361/760; 361/768; 361/771; 310/348; 310/349; 310/313 R; 310/368
[58] Field of Search ..................................... 310/348–353, 310/368, 313 R; 361/760–761, 764, 767–768, 771; 174/255, 259, 260–261; 228/179.1, 180.1, 180.21, 180.22

[56] References Cited

U.S. PATENT DOCUMENTS

| | | |
|---|---|---|
| 3,303,393 | 2/1967 | Hymes et al. . |
| 4,141,543 | 4/1979 | Hayakawa et al. . |
| 4,604,644 | 8/1986 | Beckham et al. . |
| 4,749,120 | 6/1988 | Hatada et al. ........................... 228/123 |
| 5,012,969 | 5/1991 | Hatada et al. ........................... 228/104 |
| 5,235,135 | 8/1993 | Knecht et al. ........................... 310/312 |
| 5,291,460 | 3/1994 | Harada et al. ........................... 310/348 |

FOREIGN PATENT DOCUMENTS 2909370  3/1979  Germany .

*Primary Examiner*—Bot L. Ledynh
*Attorney, Agent, or Firm*—Howell & Haferkamp, L.C.

[57] ABSTRACT

An opening is formed in a region of a circuit board opposite a vibration region E of a piezoelectric element. The piezoelectric element is mounted to the circuit board, and electrical connections extend between and support the piezoelectric element from the circuit board by a solder. The soldered connection portions are surrounded by a bonding agent. An opening in the circuit board prevents any excess bonding agent from invading the vibration region E of the piezoelectric element, and the bonding agent assists in dispersing stresses exerted on the circuit board thereby minimizing the stresses transferred to the piezoelectric element.

11 Claims, 3 Drawing Sheets

MOUNTING STRUCTURE FOR MOUNTING A PIEZOELECTRIC ELEMENT

CROSS-REFERENCE TO RELATED APPLICATION

This application is a continuation of application Ser. No. 08/255,362 filed Jun. 8, 1994, now abandoned, which was a continuation of application Ser. No. 08/134,415 filed Oct. 8, 1993, now U.S. Pat. No. 5,359,494.

BACKGROUND OF THE INVENTION

1. Field of the Invention

The present invention relates to a mounting structure for, and a method of, mounting a piezoelectric element to a circuit board.

2. Description of the Prior Art

Extended use is made of some electronic parts such as piezoelectric filters which utilize piezoelectric effect. Such piezoelectric filters include surface elastic wave filters which utilize propagation of surface elastic waves.

Referring to FIG. 1, there is illustrated a chip type surface wave filter as an example of a piezoelectric element. The piezoelectric element 5 includes connecting electrodes 9 formed in the vicinity of opposite ends of the piezoelectric element and a vibration region E located between the connecting electrodes 9. The piezoelectric element 5 uses a glass plate 15 as an element substrate on which comb electrodes are provided. A zinc oxide (ZnO) film 18 is formed so as to cover the comb electrodes for formation of the vibration region E of the piezoelectric element 5.

The piezoelectric element 5 has its length L greater than its width W, and has a ratio L/W ranging from 3 to 5 to exhibit its elongated structure.

In the prior art, to mount the piezoelectric element 5 on a circuit board 10 the piezoelectric element 5 is directly connected with and fixed to the circuit board 10 through a solder 7. This produces a problem in that application of mechanical or thermal stress to the circuit board 10 causes the stresses to be directly exerted to the piezoelectric element 5 through connection portions. The piezoelectric element 5, which has the elongated structure, is therefore likely to be bent in the direction of the length thereof (i.e., an arrow B in FIG. 1) as the stress is exerted thereon. The piezoelectric element 5, being formed with the glass plate 15, is hard and fragile and hence is likely to be cracked in the vicinity of the solder connection portions if the piezoelectric element is made to bend as described above. There is also a problem of the solder 7 being exfoliated to result in the electric characteristics of the piezoelectric element 5 being deteriorated.

Further, another problem occurs upon mounting the piezoelectric element 5 on a resin substrate and the like. The thermal expansion coefficients of the glass and the resin are different from each other (thermal expansion coefficient of the glass is approximately $3-5 \times 10^{-6}$ while that of the epoxy resin being approximately $15 \times 10^{-6}$) and hence any stress due to the difference between the thermal expansion coefficients may cause the piezoelectric element 5 to crack.

SUMMARY OF THE INVENTION

To solve these problems in the prior art, it is an object of the present invention to provide a mounting structure of a piezoelectric element, the piezoelectric element being mounted to a circuit board, wherein mechanical or thermal stress exerted on the circuit board is not substantially transferred to the piezoelectric element and hence no crack is produced, and wherein electric characteristics of the piezoelectric element are not deteriorated.

To achieve the above objective, a mounting structure for a piezoelectric element having longitudinal ends according to the present invention comprises connecting electrodes disposed in the vicinity of opposite longitudinal ends of the piezoelectric element, a vibration region located between the connecting electrodes, and a circuit board to which the piezoelectric element is directly fixed by a solder connection between the connecting electrodes and the circuit board. Further, a bonding agent is applied to surrounding regions of the soldered connection portions between the connecting electrodes and the circuit board for fixing the piezoelectric element and the circuit board in a united manner, the surrounding regions being kept away from the vibration region of the piezoelectric element.

In accordance with the present invention, the surrounding regions of the soldered connection portions between the piezoelectric element and the circuit board are filled with a bonding agent for fixing the circuit board and the piezoelectric element in a united manner. The surrounding regions are segregated from the vibration region of the piezoelectric element, so that any mechanical or thermal stress to the circuit board, although being applied to the piezoelectric element through the soldered connection portions, is largely dispersed by the bonding agent. Hence the stress applied to the piezoelectric element is reduced thereby minimizing cracking and minimizing deterioration of the electrical characteristics in the piezoelectric element due to stress.

The mounting structure for a piezoelectric element according to the present invention is further characterized in that it includes means disposed in the circuit board for preventing the bonding agent applied to the surrounding regions of the soldered connection portions from invading the vibration region of the piezoelectric element.

Further, in according with the present invention, any excess bonding agent applied to the soldered connection portions is disposed through the bonding agent invasion prevention means in the circuit board and hence the bonding agent is prevented from invading and adhering to the vibration region of the piezoelectric element.

BRIEF DESCRIPTION OF THE DRAWINGS

The above and other objects, features and advantages of the present invention will be better understood from reading the following Description Of The Preferred Embodiments taken in conjunction with the accompanying drawings in which.

DETAILED DESCRIPTION OF PREFERRED EMBODIMENTS

In what follows, there will be described some embodiments of a mounting structure of a piezoelectric element according to the present invention with reference to the accompanying drawings. Like symbols in the description of the present embodiments are used to indicate like parts, and hence the overlapping detailed description thereof will be omitted.

Figure 1:
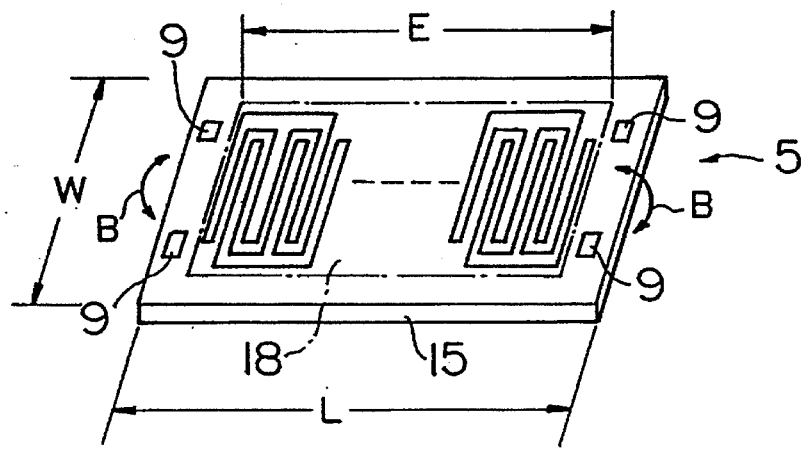
FIG. 1 is an isometric view illustrating a piezoelectric element of the present invention.
Figure 2:
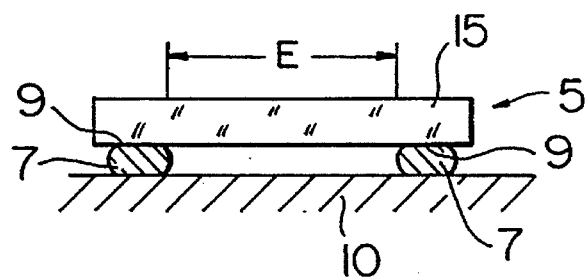
FIG. 2 is a side elevation view illustrating a prior art mounting structure of a piezoelectric element.
Figure 3:
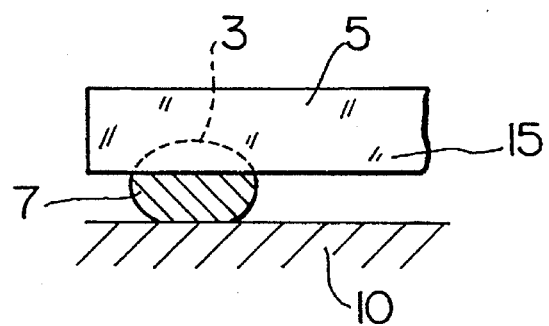
FIG. 3 is a side elevation view illustrating inconvenience of the prior art mounting structure of a piezoelectric element.

FIG. 1 illustrates a mounting structure of a piezoelectric element 5 having longitudinal ends according to the first embodiment of the present invention.

Figure 4:
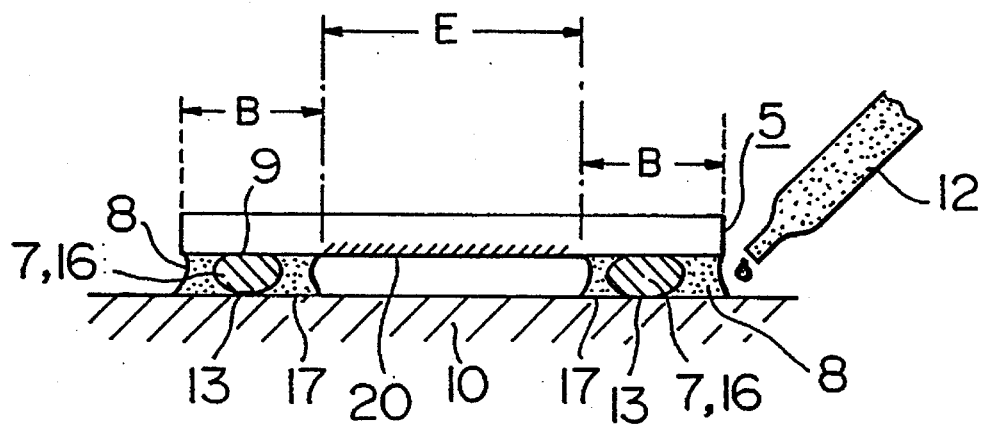
FIG. 4 is a side elevation view illustrating a mounting structure of a piezoelectric element according to a first embodiment of the present invention.

Connecting electrodes 9 are formed on opposite longitudinal ends of the piezoelectric element 5, and a vibration region E exists between the connecting electrodes. The piezoelectric element 5 is connected with and fixed to a circuit board 10 by connecting the connecting electrodes 9 with the circuit board 10 through a solder (see FIG. 4). Surrounding regions 17 are formed around the solder connections, the surrounding regions being segregated from the vibration region.

In the operation of mounting the piezoelectric element 5 constructed as above on the circuit board 10, a solder cream, for example, is applied to the circuit board at solder connection portion regions 13. The piezoelectric element 5 is positioned in relation to the circuit board 10 such that solder connections between the connecting electrodes 9 and the circuit board are made utilizing the solder cream. The solder connection is preferably made through reflowing. Hereby, the piezoelectric element 5 is mounted on the circuit board.

In an alternative embodiment, solder bumps 16 are formed to the connecting electrodes 9 by supplying a solder 7 on the connecting electrodes 9 of the piezoelectric element 5 prior to positioning the piezoelectric element. The piezoelectric element 5 is positioned relative to the circuit board 10 and the piezoelectric element is mounted to the circuit board. In this embodiment the piezoelectric element 5 and circuit board 10 are both heated to melt the solder bumps 16 thereby creating solder connections to facilitate mounting of the piezoelectric element on the circuit board. Surrounding regions 17 are formed around the solder connections, the surrounding regions being segregated from the vibration region E.

In succession, surrounding regions 17 are filled, with the aid of a dispenser 12 for example, with a bonding agent 8 (comprising thermosetting resin, etc.) to distribute any stress exerted on the soldered connection portions. The bonding agent 8 does not invade the vibration region E.

In the present embodiment, the surrounding regions 17 of the solder connection portions between the piezoelectric element 5 and the circuit board 10 are filled with the bonding agent 8 serving to disperse any stress exerted on the soldered connection portions. Accordingly, any mechanical or thermal stress exerted on the circuit board 10 is substantially dispersed and reduced by the bonding agent 8. This results in the piezoelectric element being less likely to crack, improves its resistance to bending, and minimizes exfoliation of the solder, all without deteriorizing the electrical characteristics of the piezoelectric element which might otherwise be caused by the stress.

Although the piezoelectric element is likely to be cracked in the prior art when the circuit board 10 is made of resin (because of the difference in thermal expansion coefficients therebetween), in the present embodiment any stress from the circuit board 10 is substantially dispersed through the bonding agent 8 and hence any stress which might otherwise be exerted on the piezoelectric element 5 is reduced. Accordingly, fear of the piezoelectric element 5 being cracked is reduced and the resistance against thermal shock is improved. These improvements are attained even when using an epoxy resin board.

Figure 5A:
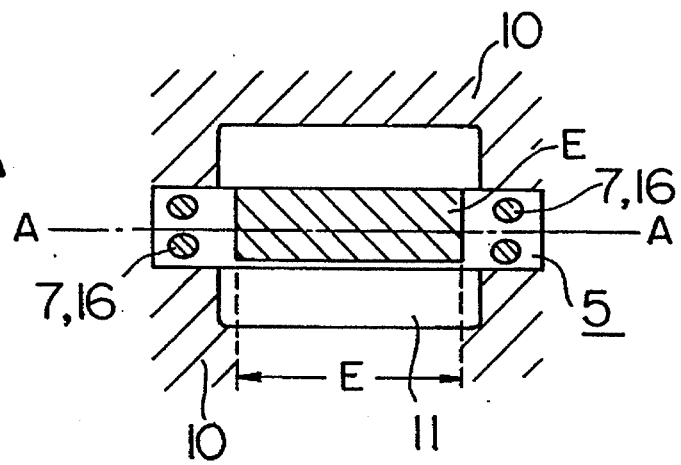
FIG. 5A is a top plan view of an alternative embodiment of the present invention illustrating a mounting structure of a piezoelectric element having an opening in the circuit board providing bonding agent prevention means.
Figure 5B:
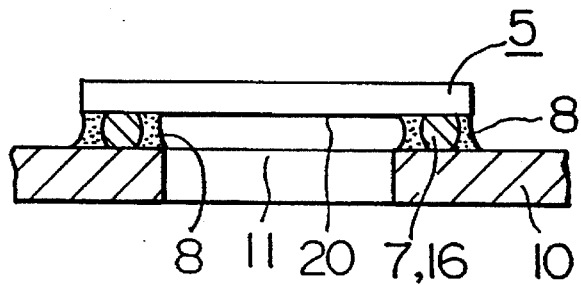
FIG. 5B is a side cross-sectional view taken along line AA of FIG. 5A illustrating the mounting structure of FIG. 5A.

Referring to FIGS. 5A and 5B, there is illustrated a mounting structure of a piezoelectric element according to a second embodiment of the present invention. The embodiment is provided as a result of a further improvement of the first embodiment in which an opening 11, as bonding agent prevention means, is formed in a region of the circuit board 10 opposite the vibration region E of the piezoelectric element 5. The opening 11 penetrates the circuit board 10 preventing excess bonding agent 8 from invading and adhering to the vibration region E when the surrounding regions of the soldered connection portions are filled with the bonding agent 8.

In this embodiment, the opening 11 is formed in the region of the circuit board 10 opposite to the vibration region E of the piezoelectric element 5. Accordingly, any excess bonding agent 8 is discharged away from the vibration region when the bonding agent 8 is applied and hardened around the soldered connection portions to prevent the bonding agent 8 from invading and adhering to the vibration region E of the piezoelectric element 5.

There is a risk that the characteristics of the piezoelectric element will deteriorate if resin such as the bonding agent 8 adheres to the vibration region E of the piezoelectric element 5. However, the present embodiment ensures that the bonding agent 8 does not adhere to the vibration region E thereby minimizing the risk of deteriorated piezoelectric element characteristics. Additionally, any mechanical or thermal stress exerted on the circuit board 10 is dispersed by the bonding agent 8 to ensure the identical advantage to that of the first embodiment.

Figure 6A:
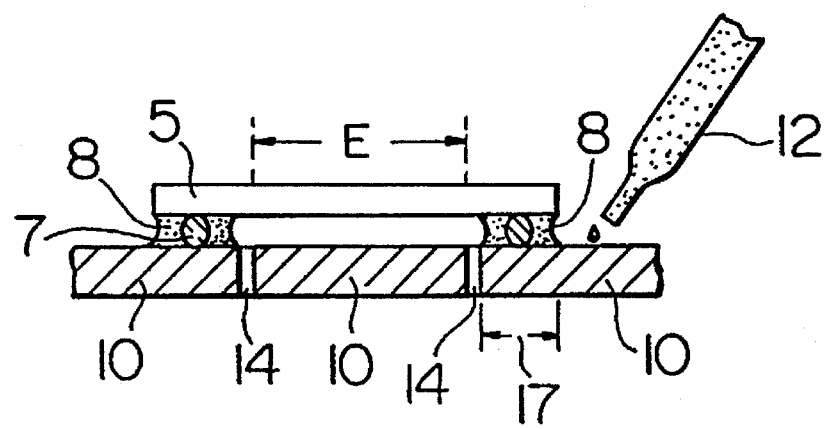
FIG. 6A is a side cross-sectional view across a longitudinal axis of the piezoelectric element in FIG. 6B illustrating the mounting structure of FIG. 6B.
Figure 6B:
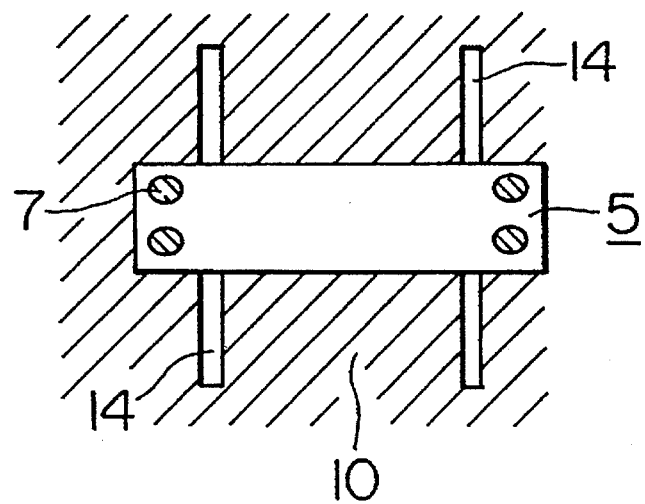
FIG. 6B is a top plan view illustrating another embodiment of the present invention having two slots in the circuit board providing bonding agent prevention means.

Referring to FIGS. 6A, a side view, and 6B, a top plan view, there is illustrated a third embodiment of the present invention. Although in the second embodiment, the opening 11 is formed in the circuit board 10 as a measure to prevent the bonding agent 8 from invading and adhering to a lower portion 20 of the vibration region E of the piezoelectric element 5, a slot 14 may be provided as disclosed in the present embodiment in the circuit board 10 at a boundary between the vibration region E and the surrounding region 17 of the soldered connection portion. Hereby, the bonding agent 8 is prevented from invading the vibration region E of the piezoelectric element 5.

It should be noted that although in the aforementioned embodiments use is made of the thermal resin as the bonding agent, use may be made of thermoplastic resin for example, and further use may be made of arbitrary insulating materials if stress dispersion is allowed therewith.

Further, although in the aforementioned embodiments a piezoelectric element was demonstrated by way of example, the present invention may be applied to other elements such as diodes and optical detector elements which are mountable on a circuit board with the same mounting technique.

In accordance with the present invention, the surrounding regions of the soldered connection portions between the piezoelectric element and the circuit board are filled with a bonding agent, so that mechanical or thermal stress is dispersed by the bonding agent even though they are exerted on the circuit board, and hence the stress applied to the piezoelectric element is reduced. Thus, a fear of the piezoelectric element being cracked is reduced, and electric characteristics of the piezoelectric element are not deteriorated owing to the stress.

Additionally, there is provided bonding agent invasion prevention means on a region of the circuit board opposite to the vibration region of the piezoelectric element, so that any excess bonding agent is removed by the bonding agent invasion prevention means upon the bonding agent being applied to and hardened around the soldered connection portions. The excess bonding agent is thereby prevented from invading and adhering to the vibration region of the piezoelectric element. Thus, a fear of the characteristics of the piezoelectric element being deteriorated is reduced.

Although illustrated embodiments of the present invention are described herein with reference to the accompanying drawings, it is to be understood that the invention is not limited to those precise embodiments and that various other changes and modifications may be effected therein by one skilled in the art without departing from the scope or spirit of the invention. The scope of the invention is defined solely by the claims, and their equivalents.

What is claimed is:

1. In a mounting arrangement for mounting a piezoelectric element to a circuit board, the piezoelectric element having a plurality of electrical connections, the electrical connections extending between and directly supporting the piezoelectric element from the circuit board, a substantially nonconductive bonding agent, which is different from the electrical connections, formed at least partially around at least one of the electrical connections in order to strengthen the at least one electrical connection and substantially surrounding the at least one electrical connection, the improvement comprising:

the piezoelectric element having opposite ends and a medial portion located therebetween, the electrical connections being located at the opposite ends so that the medial portion of the piezoelectric element is free to vibrate; and the bonding agent not extending beneath the medial portion.

2. The mounting arrangement of claim 1 wherein each of said electrical connections comprises a solder bump, the solder bumps spacing the piezoelectric element from the circuit board, the bonding agent being formed around and substantially surrounding at least one of the solder bumps.

3. The mounting arrangement of claim 2 wherein the bonding agent surrounds each of the solder bumps and extends between the piezoelectric element and the circuit board.

4. In a mounting arrangement for mounting a piezoelectric element to a circuit board, the piezoelectric element having opposite ends, a medial portion located therebetween, and a plurality of electrical connections located at the opposite ends extending between and supporting the piezoelectric element from the circuit board so that the medial portion is free to vibrate, the improvement comprising a substantially nonconductive bonding agent which is different from said electrical connections formed at least partially around at least one of the electrical connections and the circuit board having means for preventing invasion of said bonding agent into the medial portion of the piezoelectric element.

5. The mounting arrangement of claim 4 wherein the invasion prevention means comprises an opening formed in the circuit board in a region opposed to the medial portion of the piezoelectric element.

6. The mounting arrangement of claim 5 wherein said bonding agent is formed around and substantially surrounds at least one of the electrical connections.

7. The mounting arrangement of claim 6 wherein said bonding agent surrounds each of the electrical connections and extends between the piezoelectric element and the circuit board.

8. The mounting arrangement of claim 4 wherein the invasion prevention means comprises at least one slot formed in the circuit board in a region substantially adjacent at least one of the electrical connections and opposed to the circumference of the medial portion of the piezoelectric element.

9. The mounting arrangement of claim 8 wherein said bonding agent is formed around and substantially surrounds the at least one of the electrical connections.

10. The mounting arrangement of claim 9 wherein said bonding agent surrounds each of the electrical connections and extends between the piezoelectric element and the circuit board.

11. In a mounting arrangement for mounting a piezoelectric element to a circuit board, the piezoelectric element having opposite ends, a medial portion located therebetween, and a plurality of electrical connections, comprising solder bumps, located at the opposite ends extending between and supporting the piezoelectric element in spaced relation to the circuit board so that the medial portion is free to vibrate, the improvement comprising said electrical connections directly supporting the piezoelectric element from the circuit board, a bonding agent formed around and surrounding each of the solder bumps and extending between the piezoelectric element and the circuit board, and the circuit board having means for preventing invasion of the bonding agent into the medial portion of the piezoelectric element.

* * * * *